(12) United States Patent
Yamazaki

(10) Patent No.: US 6,169,293 B1
(45) Date of Patent: *Jan. 2, 2001

(54) DISPLAY DEVICE

(75) Inventor: Shunpei Yamazaki, Tokyo (JP)

(73) Assignee: Semiconductor Energy Labs, Kanagawa-Ken (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/360,341

(22) Filed: Jul. 22, 1999

Related U.S. Application Data

(63) Continuation of application No. 08/751,338, filed on Nov. 18, 1996, now Pat. No. 5,952,708.

(30) Foreign Application Priority Data

Nov. 17, 1995 (JP) .................................................. 7-323674

(51) Int. Cl.[7] .......................... H01L 27/01; H01L 29/04; H01L 23/58
(52) U.S. Cl. .......................... 257/72; 257/350; 257/639; 257/640; 257/643
(58) Field of Search ................................ 257/59, 72, 350, 257/639, 640, 642, 643

(56) References Cited

U.S. PATENT DOCUMENTS

| | | |
|---|---|---|
| 4,226,898 | 10/1980 | Ovshinsky et al. . |
| 4,523,370 | 6/1985 | Sullivan et al. . |
| 4,557,036 | 12/1985 | Kyuragi et al. . |
| 4,597,637 | 7/1986 | Ohta . |
| 4,800,174 | 1/1989 | Ishihara et al. . |
| 4,864,376 | 9/1989 | Aoki et al. . |
| 5,003,356 | 3/1991 | Wakai et al. . |
| 5,055,899 | 10/1991 | Wakai et al. . |
| 5,056,895 | 10/1991 | Kahn . |
| 5,084,905 | 1/1992 | Sasaki et al. . |
| 5,091,334 | 2/1992 | Yamazaki et al. . |
| 5,132,821 | 7/1992 | Nicholas . |
| 5,200,846 | 4/1993 | Hiroki et al. . |
| 5,227,900 | 7/1993 | Inaba et al. . |
| 5,235,195 | 8/1993 | Tran et al. . |
| 5,287,205 | 2/1994 | Yamazaki et al. . |
| 5,289,016 | * 2/1994 | Noguchi ................................. 257/57 |
| 5,327,001 | 7/1994 | Wakai et al. . |
| 5,488,000 | * 1/1996 | Zhang et al. . |
| 5,495,353 | * 2/1996 | Yamazaki et al. ..................... 359/54 |
| 5,500,538 | 3/1996 | Yamazaki et al. . |
| 5,568,288 | 10/1996 | Yamazaki et al. . |
| 5,583,369 | * 12/1996 | Yamazaki et al. .................... 257/635 |
| 5,684,365 | 11/1997 | Tang et al. . |
| 5,686,328 | 11/1997 | Zhang et al. . |
| 5,705,829 | * 1/1998 | Miyanaga et al. ...................... 257/66 |
| 5,731,628 | * 3/1998 | Terashima ............................. 257/637 |
| 5,763,899 | 6/1998 | Yamazaki et al. . |
| 5,821,138 | 10/1998 | Yamazaki et al. . |
| 5,844,254 | * 12/1998 | Manning et al. ........................ 257/67 |
| 5,849,043 | * 12/1998 | Zhang et al. ......................... 29/25.01 |
| 5,899,547 | 5/1999 | Yamazaki et al. . |
| 5,905,555 | 5/1999 | Yamazaki et al. . |
| 5,933,205 | 8/1999 | Yamazaki et al. . |
| 5,946,059 | 8/1999 | Yamazaki et al. . |
| 5,963,278 | 10/1999 | Yamazaki et al. . |
| 6,011,277 | 1/2000 | Yamazaki . |

FOREIGN PATENT DOCUMENTS

| | | |
|---|---|---|
| 55-32026 | 3/1980 | (JP) . |
| 1-156725 | 6/1989 | (JP) . |
| 6-186578 | 7/1994 | (JP) . |

* cited by examiner

Primary Examiner—Ngân V. Ngô
(74) Attorney, Agent, or Firm—Fish & Richardson P.C.

(57) ABSTRACT

A resin material having a small relative dielectric constant is used as a layer insulation film 114. The resin material has a flat surface. A black matrix or masking film for thin film transistors is formed thereon using a metal material. Such a configuration prevents the problem of a capacity generated between the masking film and a thin film transistor.

12 Claims, 5 Drawing Sheets

DISPLAY DEVICE

This is a continuation of U.S. application Ser. No. 08/751,338, filed Nov. 18, 1996, now U.S. Pat. No. 5,952,708.

BACKGROUND OF THE INVENTION

1. Field of the Invention

The present invention relates to a configuration applicable to flat panel displays represented by active matrix liquid crystal displays and EL type displays.

2. Description of Related Art

Conventional known flat panel displays., include active matrix liquid crystal displays having a configuration wherein a thin film transistor for switching is provided to each of a number of pixels provided in the form of a matrix and wherein charge going in and out each pixel electrode is controlled by the thin film transistor.

In such a configuration, a masking means (a light shielding means) must be provided to prevent light from entering the thin film transistors provided in a pixel region.

A metal film is currently chosen as the masking means (the light shielding means) from the viewpoint of dispersion of impurities and stability. Further, such a masking means for thin film transistors is generally provided to serve also as a black matrix which covers peripheral edge regions of pixel electrodes.

Such a configuration has the following problems. The first problem is that a capacity is generated between the masking film and the thin film transistors, and this adversely affects the operation of the thin film transistors. The second problem is that since the masking film is generally formed on a substrate having irregularity thereon which can make the masking function insufficient.

The problem associated with the masking function equally applies to the black matrix provided so as to overlap with the edges of pixels.

It is an object of the invention disclosed in this specification to provide a configuration which solves the problems associated with a masking film for shading thin film transistors to achieve high performance as an active matrix display.

SUMMARY OF THE INVENTION

A configuration according to the invention disclosed in this specification is characterized in that it comprises:

thin film transistors having outputs connected to pixel electrodes;

a layer insulation film made of a resin material provided on the thin film transistors; and a masking film for shading the thin film transistors provided on the layer insulation film.

Another configuration according to the present invention is characterized in that it comprises:

a layer insulation film made of a resin material formed on thin film transistors; and a masking film for shading the thin film transistors formed on the layer insulation film made of a resin material.

Still another configuration according to the present invention is characterized in that it comprises: a plurality of pixel electrodes provided in the form of a matrix; and a black matrix for covering at least a part of peripheral regions of the pixel electrodes, the black matrix being provided on a layer insulation film made of a resin material.

DETAILED DESCRIPTION OF PREFERRED EMBODIMENT

A first embodiment of the present invention will now be described. FIGS. 1A through 1D and FIGS. 2A through 2C illustrate steps of producing a pixel portion of an active matrix liquid crystal display to be described in the present embodiment.

Figure 1A:
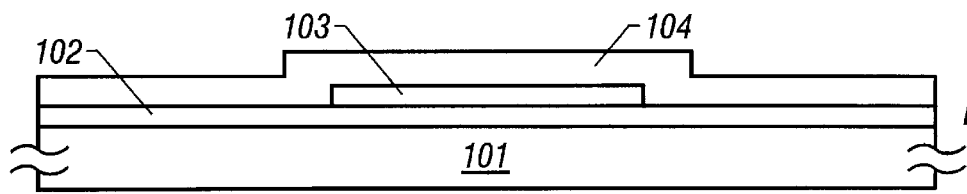
FIGS. 1A through 1D illustrate steps of producing a pixel portion of an active matrix circuit.

As shown in FIG. 1A, a silicon oxide film 102 having a thickness of 3000 Å as a backing film is first former on a glass substrate 101 using a plasma CVD process.

Next, an amorphous silicon film (not shown) is formed which will later serve as a starting film made of a thin film semiconductor for forming an active later of a thin film transistor. The amorphous silicon film (not shown) is formed to a thickness of 500 Å using a plasma CVD process.

The amorphous silicon film is then crystallized using a heating process or irradiating it with laser beams or using a process which is a combination of the heating process an irradiation with laser beams to obtain a crystalline silicon film (not shown).

The crystalline silicon film (not shown) is patterned to obtain an active layer 103 of a thin film transistor.

Next, a plasma CVD process is performed to form a silicon oxide film 104 having a thickness of 1000 Å which serves as a gate insulation film by covering the active layer 103 as shown in FIG. 1A. Thus, the state as shown in FIG. 1A is realized.

Next, an aluminum film (not shown) including 0.1% scandium by weight is formed to a thickness of 4000 Å using a sputtering process. This aluminum film will serves as a gate electrode later.

After forming the aluminum film, a dense anodic oxide film (not shown) is formed on the surface thereof to a thickness of 100 Å. This anodization is carried out by using the aluminum film as an anode in an electrolyte obtained by neutralizing an ethylene glycol solution including 3% tartaric acid with aqueous ammonia.

Further,-patterning is performed by providing a resist mask (not shown). A gate electrode 105 is formed as a result of the patterning.

After the formation of the gate electrode 105, anodization is carried out again with the resist mask (not shown) left in place. This anodization is carried out using an aqueous solution including 3% oxalic acid as an electrolyte.

This anodization selectively takes place only on side faces of the gate electrode 105 because of the leftover resist mask (not shown). The anodic oxide film formed in this step has a porous structure.

Thus, a porous anodic oxide film 106 is formed on the side faces of the gate electrode 105.

This porous anodic oxide film can be grown to a thickness on the order of several $\mu$m. The size of this growth can be controlled by the duration of the anodization.

Here, the thickness of the anodic oxide film 106 is 6000 Å.

Next, anodization is carried out again using an electrolyte obtained by neutralizing an ethylene glycol solution including 3% tartaric acid with aqueous ammonia. In this anodizing step, since the electrolyte penetrates the porous anodic oxide film 106, a dense anodic oxide film 107 is formed around the gate electrode 105.

The thickness of this dense anodic oxide film 107 is 500. The primary function of this dense anodic oxide film 107 is to cover the surface of the gate electrode to prevent generation of hillocks and whiskers in subsequent steps.

It also has a function of protecting the gate electrode 105 so that it is not etched at the same time when the porous anodic oxide film 106 is removed later.

It also has a function of contributing to formation of an offset gate region which is formed later using the porous anodic oxide film 106 as a mask.

Figure 1B:
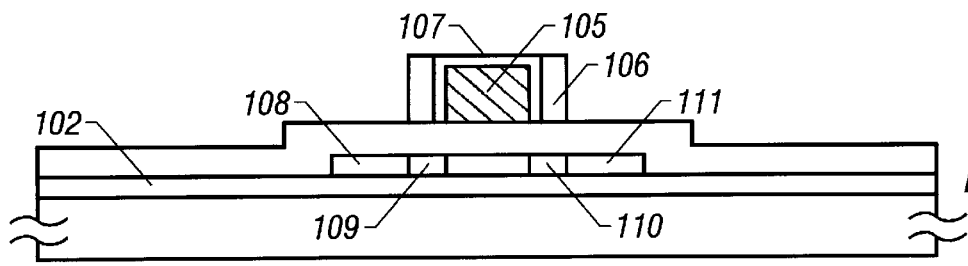

Thus, the state as shown in FIG. 1B is realized.

In this state, impurity ions are implanted. P (phosphorus) ions are implanted here to obtain an N-channel type thin film transistor.

When implantation of impurity ions is carried out in the state as shown in FIG. 1B, the impurity ions are selectively implanted in regions indicated by 108 and 111. That is, the regions 108 and 111 become high density impurity regions.

The impurity ions are not implanted in a region 109 directly under the gate electrode 105 because the gate electrode 105 serves as a mask. This region 109 serves as a channel formation region.

The impurity ions are not implanted also in a region indicated by 110 because the porous anodic oxide film 105 and the dense anodic oxide film 107 serve as a mask. The region indicated by 107 serves as an offset gate region which functions neither as a source/drain region nor as a channel formation region.

Particularly, the offset gate region has a function of moderating the strength of an electric field formed between the channel formation region and the drain region. The presence of the offset gate region allows the OFF current value of the thin film transistor to be reduced and suppresses deterioration of the same.

Thus, the source region indicated by 108, the channel formation region indicated by 109, the offset gate region indicated by 110 and the drain region indicated by 111 are formed on a self-alignment basis.

When the implantation of impurity ions is completed, the porous anodic oxide film 106 is selectively removed. Then, an annealing process is performed by means of irradiation with laser beams. Since laser beams can be directed to the vicinity of the interface between the high density impurity region and the offset gate region, the junction portion which has been damaged by the implantation of impurity ions can be sufficiently annealed.

When the state as shown in FIG. 1B is realized, a silicon oxide film 112 having a thickness of 2000 is formed as a first layer insulation film.

A silicon nitride film or a multi-layer film consisting of a silicon oxide film and a silicon nitride fi-m may be used as this first layer insulation film.

Figure 1C:
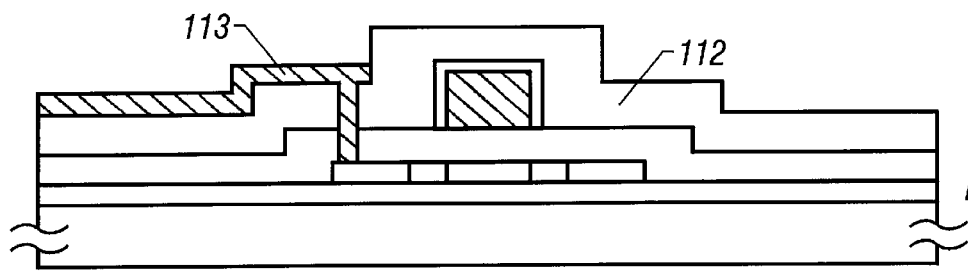

Next, a contact hole is formed in the first layer insulation film 112 to form a source electrode 113 which contacts with the source region of the thin film transistor. Thus, the state as shown in FIG. 1C is realized.

Figure 1D:
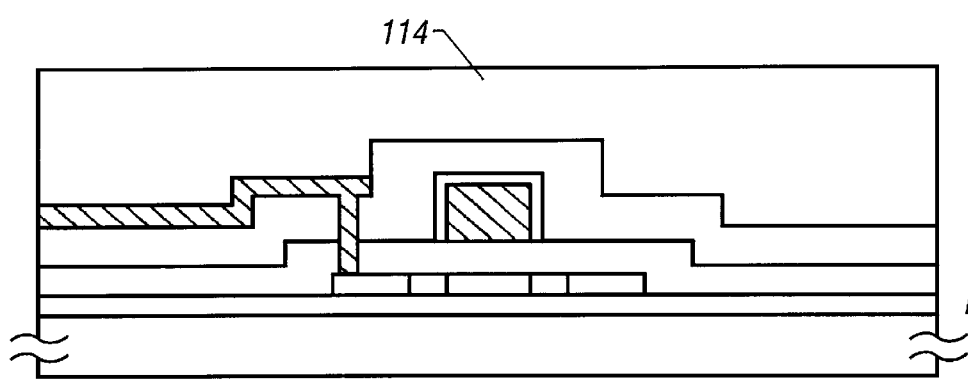

Then, a second layer insulation film 114 is formed using transparent polyimide resin or acrylic resin. The layer insulation film 114 made of a resin material is formed to have a flat surface. Thus, the state as shown FIG. 1D is realized.

Figure 2A:
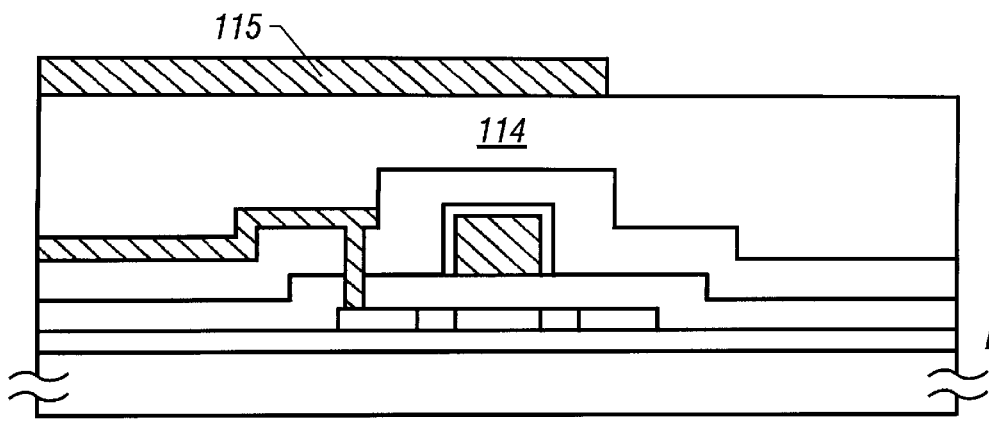
FIGS. 2A through 2C illustrate steps of producing a pixel portion of an active matrix circuit.

Next, as shown in FIG. 2A, a chromium film is formed and patterned into a masking film 115 which serves as a masking film and also as a black matrix for the thin film transistor.

A material having a relative dielectric constant equal to or smaller than 3 is chosen as the resin material for forming the second layer insulation film 114. The film is to be made as thick as several μm. A resin material is advantageous for such an application because it does not prolong the time required for the production steps even when it is made thick.

Such a configuration makes it possible to prevent generation of a capacity between the masking film 115 made of chromium and the thin film transistor located thereunder.

Further, the surface of the second layer insulation film 114 can be easily flattened if it is formed from a resin material. This makes it possible to prevent leakage of light originating from surface irregularity.

When the state as shown in FIG. 2A is realized, a third layer insulation film 116 is formed using a resin material, silicon oxide film, or silicon nitride film. Here, the same resin material as for the second layer insulation film 114 is used for this third layer insulation film 116.

The use of a resin material as the third layer insulation film advantageously solves the problem of generation of a capacity between a pixel electrode to be formed later and the masking film 115 and flattens the surface on which the pixel electrode is to be formed.

Figure 2B:
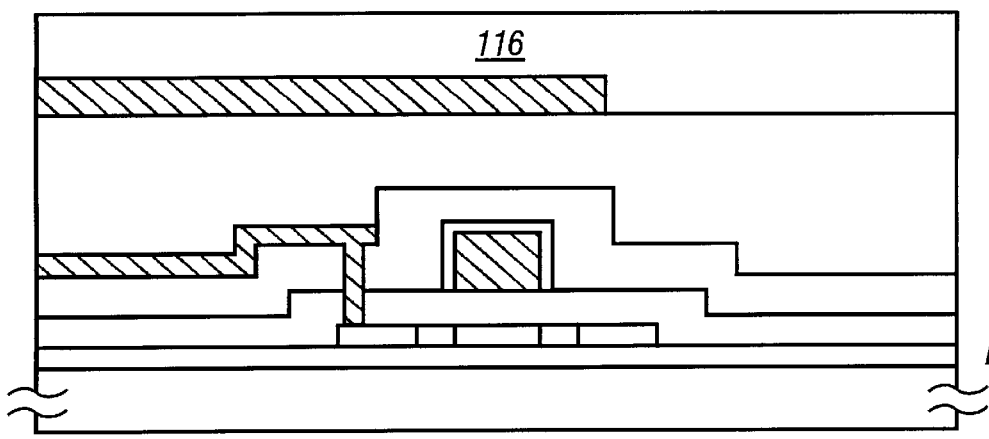

Thus, the state as shown in FIG. 2B is realized. Then, a pixel electrode 117 is formed by forming a contact hole, forming an ITO electrode which constitutes the pixel electrode, and performing patterning.

Figure 2C:
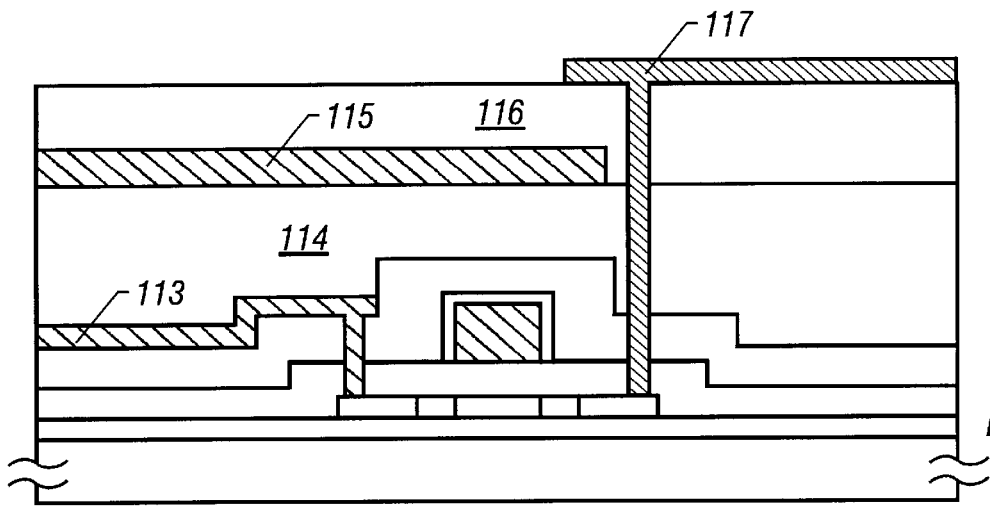

This completes the configuration as shown in FIG. 2C. In the configuration shown in FIG. 2C, the layer insulation film provided between the thin film transistor (especially the source electrode 113) and the masking film (and/or black matrix) 115 can be formed to have a small relative dielectric constant and a large thickness. This makes it possible to prevent generation of an unnecessary capacity.

The configuration as described above dan be realized because of the fact that the formation of a thick resin film is a simple industrial process which does not involve an increase in processing time as described above.

A second embodiment of the present invention will now be described.

The present embodiment is characterized in that it employs a configuration which is an improvement over the configuration described in the first embodiment to provide higher reliability.

As described above, a metal material such as chromium is used for the masking film and black matrix. From the viewpoint of long term reliability, however, concern exists about dispersion of impurities from the metal material and a short-circuit between the metal material and other electrodes or wiring.

Especially, if there is a pin hole in the layer insulation film 116 in the state as shown in FIG. 2C, a problem arises in that a short-circuit occurs between the masking film 115 (which may simultaneously serve as a black matrix) and the pixel electrode 117.

A possible method for eliminating the influence of a pin hole present in the layer insulation film 116 is to form the layer insulation film 116 as a special multi-layer film.

However, such a method is unfavorable because it can increase the number of production steps and manufacturing cost.

A configuration according to the present embodiment addresses this situation by employing a material which can be anodized for the masking film for shading the thin film transistor and by forming an anodic oxide film thereon in the configuration described in the first embodiment.

Aluminum or tantalum may be used as the material which can be anodized.

Especially, the use of aluminum will provide a preferable masking film because it allows the anodic oxide film to be colored in black or a similar dark color utilizing an anodizing technique used for industrial products such as aluminum sashes.

Figure 3A:
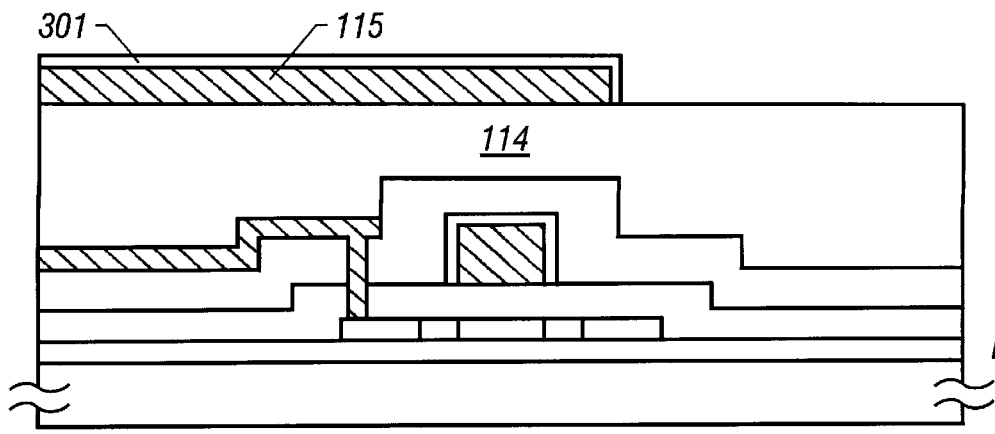
FIGS. 3A through 3C illustrate steps of producing a pixel portion of an active matrix circuit.
Figure 3B:
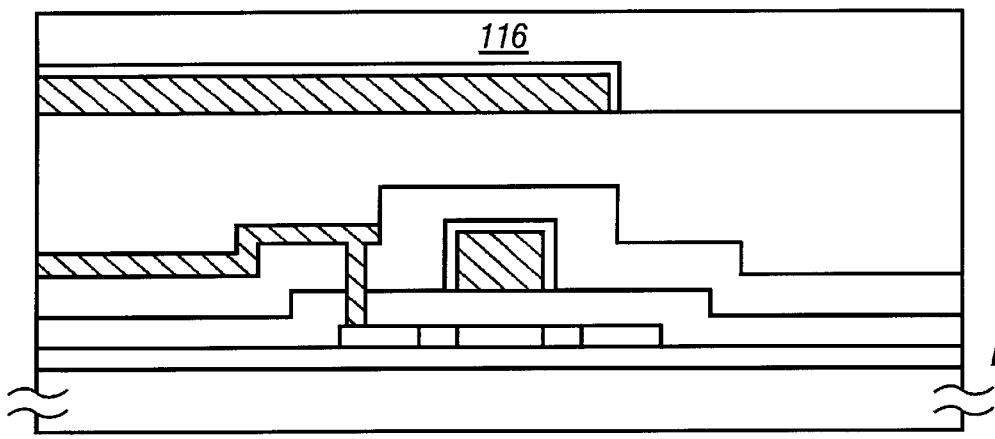
Figure 3C:
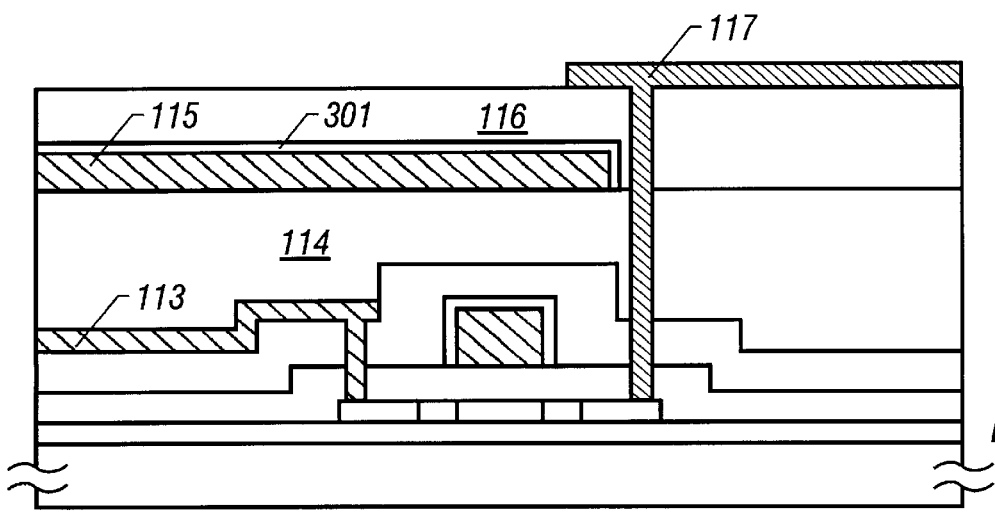

FIGS. 3A through 3C schematically show production steps according to the present embodiment. First, the state as shown in FIG. 1D is realized by the steps shown in FIGS. 1A through 1D. Then, a masking film 115 is formed as shown in FIG. 2A.

Here, aluminum is used as the masking film 115. Anodization is performed in an electrolyte to form an anodic oxide film 301 on the surface of the masking film 115 as shown in FIG. 3A.

FIG. 3A shows the masking film 301 as a masking film for shading a thin film transistor. However, it is normally extended further to also form a black matrix.

When the state as shown in FIG. 3A is realized, a third layer insulation film 116 is formed by a silicon oxide film or silicon nitride film or formed from a resin material as shown in FIG. 3B.

Further, a pixel electrode 117 is formed using ITO as shown in FIG. 3C.

Even if a pin hole exists in the layer insulation film 116, the presence of the anodic oxide film 301 prevents the pixel electrode 117 and masking film 115 from being short-circuited.

In addition, since the anodic oxide film 301 is chemically stable, it is preferable from the viewpoint of long term reliability in that it can prevent impurities in the masking film 115 from being dispersed in the neighborhood thereof.

A third embodiment of the present invention will now be described.

The present embodiment relates to a configuration in which an aperture ratio of a pixel is improved. There is a general need for a configuration of a pixel that makes the aperture ratio as large as possible. In order to obtain a large aperture ratio of a pixel, the pixel electrode must be provided to have an area which is as wide as possible.

However, a severe limitation is placed on such an attempt in that if the pixel electrode overlaps the thin film transistor or wiring, a capacity is generated therebetween.

The present embodiment provides a configuration which reduces the problem of generation of a capacity.

Figure 4A:
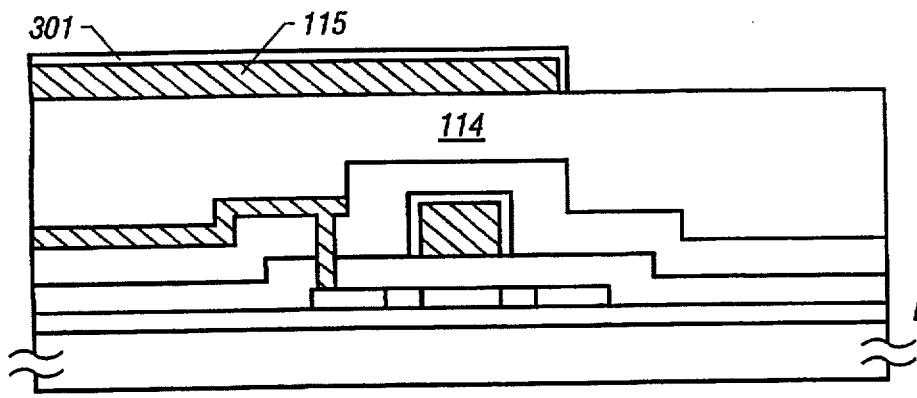
FIGS. 4A through 4C illustrate steps of producing a pixel portion of an active matrix circuit.
Figure 4B:
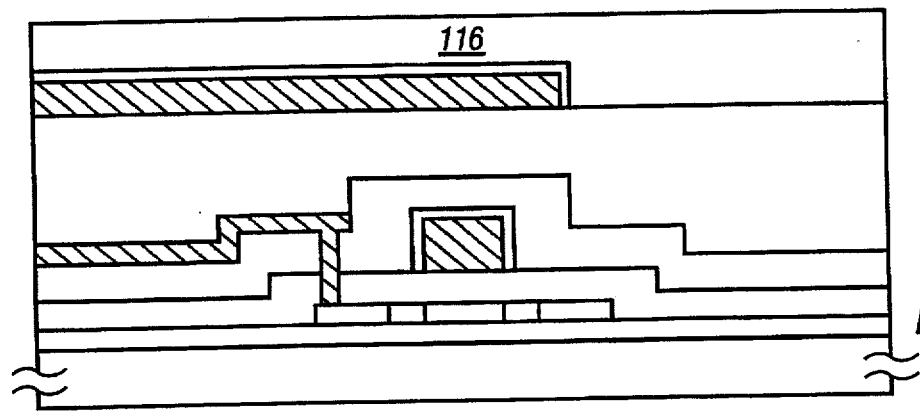
Figure 4C:
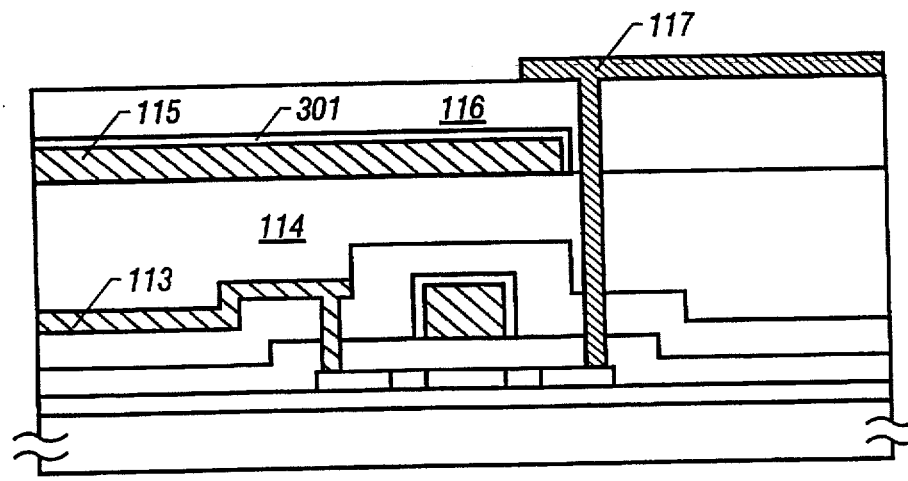

FIGS. 4A through 4C show steps of producing the configuration according to the present embodiment. The steps shown in FIGS. 4A and 4B are the same as those in FIGS. 3A and 3B.

First, a masking film 115 made of aluminum is formed as shown in FIG. 4A. An anodic oxide film indicated by 301 is formed on the surface of the masking film 115.

Further, a third layer insulation film 116 is formed as shown in FIG. 4B. The layer insulation film 116 is formed from a resin material.

A pixel electrode 117 is then formed using ITO as shown in FIG. 4C. The pixel electrode 117 is overlaid on the thin film transistor. This maximizes the aperture ratio of the pixel.

With the configuration as shown in FIG. 4C, layer insulation films 114 and 116 can be formed from a resin material having a small relative dielectric constant (as compared to a silicon oxide film or silicon nitride film) with an increased thickness. This makes it possible to reduce the problem of a capacity as described above.

Further, the area of the pixel electrode can be increased to obtain a larger aperture ratio for the pixel.

Although a top gate type is employed for a thin film transistor in the foregoing embodiments, in this embodiment 4 is described a method for manufacturing a bottom gate type thin film transistor in which a gate electrode is closer to a substrate than an active layer is.

Figure 5A:
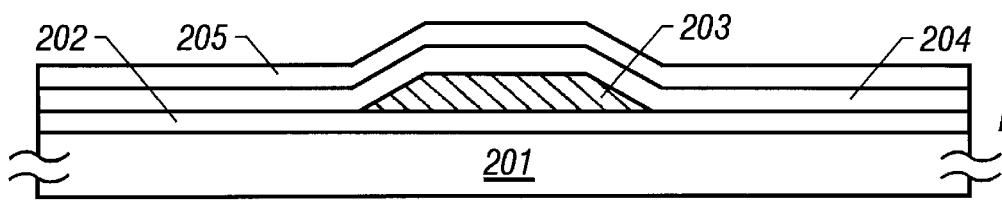
FIGS. 5A through 5D illustrate steps of producing a pixel portion of an active matrix circuit.

The manufacturing steps in accordance with this embodiment 4 are shown in FIGS. 5(A) to 5(D). First, as shown in FIG. 5(A), a silicon oxide film 202 as a base film is formed on a glass substrate 201 by sputtering. Then, a gate electrode 203 is formed from aluminum.

In this gate electrode, scandium is contained in aluminum at 0.18 weight %. Concentration of other impurities should be made as low as possible. The foregoing is for suppressing formation of protrusion called hillock or whisker formed due to extraordinary growth of aluminum in the subsequent step.

Then, a silicon oxide film 204 functioning as a gate insulating film is formed to a thickness of 500 Å by plasma CVD.

Then, an amorphous silicon film (to become a crystalline silicon film 205 later) not shown in the drawings is formed by plasma CVD as a starting film for forming an active layer of a thin film transistor. Low pressure thermal CVD ray be used instead of plasma CVD.

Then, by a laser light irradiation, the amorphous silicon film not shown in the drawings is crystallized. A crystalline silicon film 205 is then obtained. Thus, a structure shown in FIG. 5(A) is obtained.

After a structure shown in FIG. 5(A) is obtained, an active layer 206 is formed by conducting a patterning.

Then, a silicon nitride film not shown in the drawings is formed, and is shaped into a mask pattern 207 made of the silicon nitride film, by irradiating a light thereto from a rear surface side of the substrate using the gate electrode.

The mask pattern 207 is formed as follows.

Figure 5B:
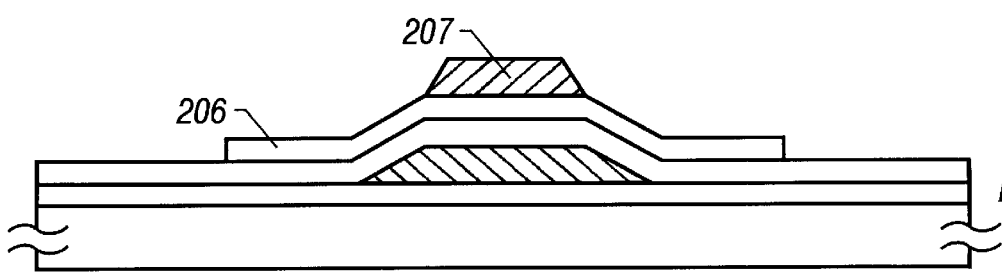

At first, a resist mask pattern is formed by light irradiation from a rear surface side of the substrate 201 using the gate electrode pattern. Further, the resist mask pattern is retreated by ashing. A pattern designated by a reference numeral 207 is obtained by patterning the silicon nitride film using the retreated resist mask pattern not shown in the drawings. Thus, the structure shown in FIG. 5(B) is obtained.

Then, an impurity doping is conducted using the mask pattern 207. For example, P(phosphorus) is used as a dopant, and plasma doping is used as a doping method.

In this step, regions 208 and 209 are doped with P. A region 210 is not doped with P.

After completion of the doping, a laser light irradiation is conducted from above to conduct activation of the doped regions and to conduct annealing of damages caused due to impact of the dopant ions.

Figure 5C:
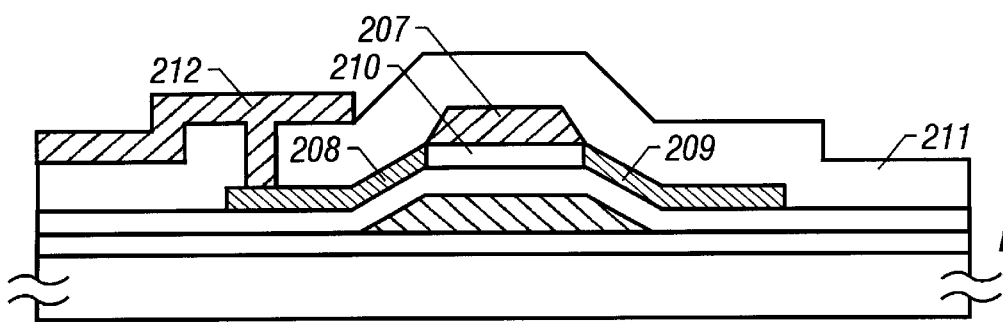

Thus, as shown in FIG. 5(C), a region 208 is formed as a source region. Also, a region 209 is formed as a drain region. Also, a region 210 is formed as a channel region.

Then, a silicon nitride film is formed as a first interlayer insulating film 211 to a thickness of 2000 Å by plasma CVD.

A silicon oxide film, silicon oxinitride film, or a multilayer film comprising a silicon oxide film aid a silicon nitride film (any one of them can be formed on the other) can be used instead of the silicon nitride single film, as the first interlayer insulating film used herein.

Then, a contact hole is formed for the source region 208 in the first interlayer insulating film 211, and a source electrode is formed to provide a contact to the source region 208. Thus, the structure shown in FIG. 5(C) is obtained.

Figure 5D:
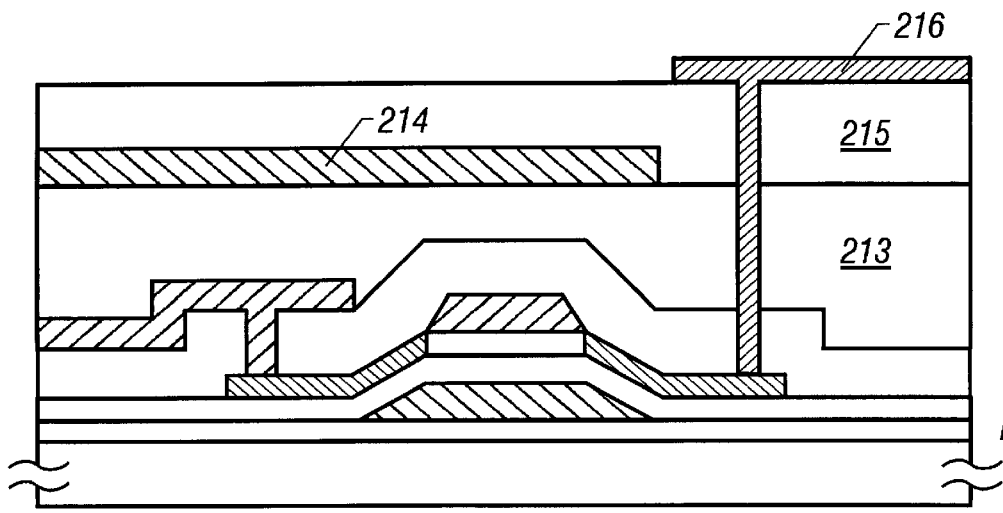
Figure 5A:
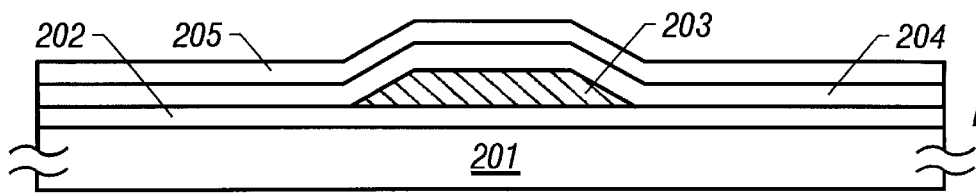
Figure 5B:
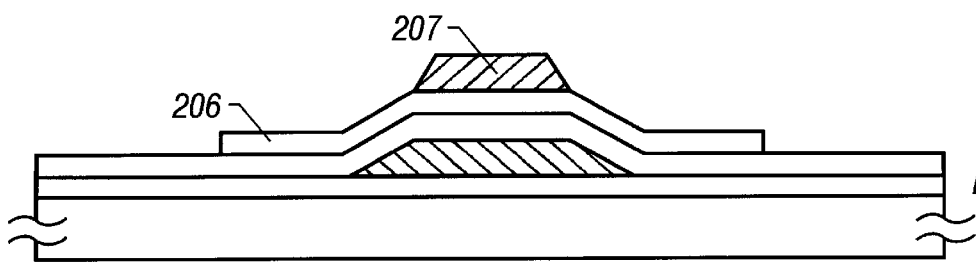
Figure 5C:
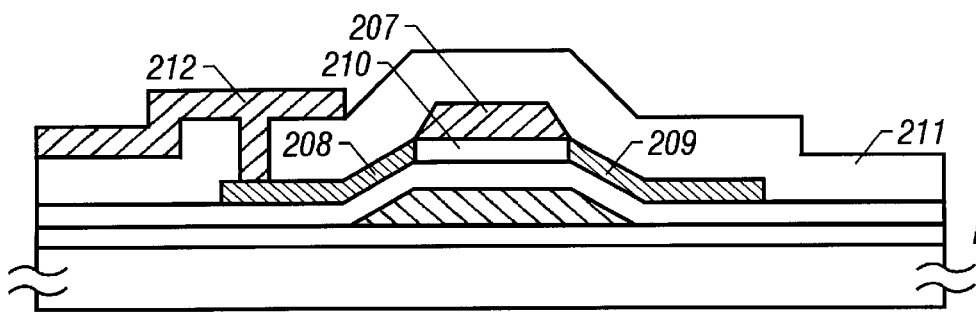
Figure 5D:
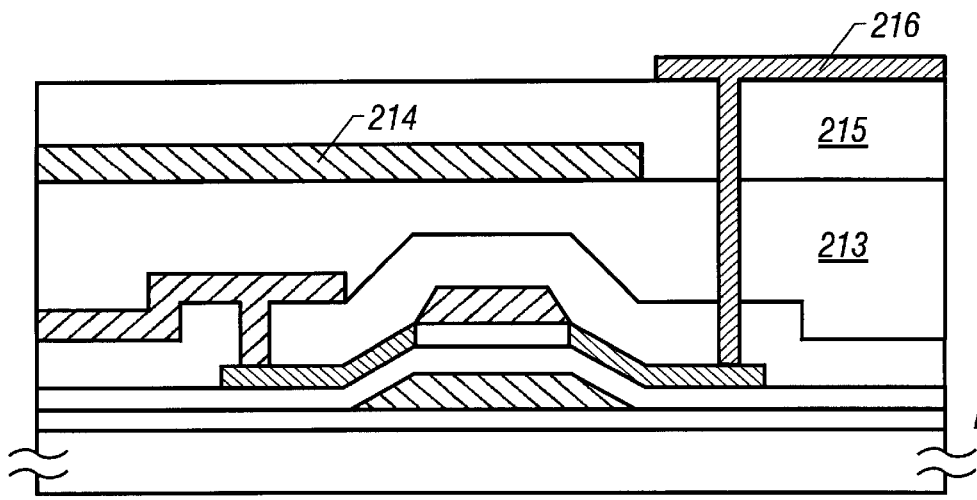

Then, as shown in FIG. 5(D), a second interlayer insulating film 213 having a flat surface is formed from a transparent polyimide resin or acrylic resin. For example, a spin coating can be employed as a film formation method.

Then, a chromium film is formed on the second interlayer insulating film 213, and is patterned to form a light-shielding film 214 which serves as both a light-shielding film and a black matrix for a thin film transistor. Then, a third interlayer insulating film 215 is formed from the same resin material film as the second interlayer insulating film 213.

A contact hole which reaches the drain region 209 is formed in the first to third interlayer insulating films 211, 213, 215. Then, ITO (indium tin oxide) film is formed on a surface of the third interlayer insulating film 215, and is patterned into a pixel electrode 216.

A thin film transistor shown in FIG. 5(D) is completed through the foregoing steps.

Using the invention disclosed in this specification, an effective masking film can be provided in a configuration of a pixel of an active matrix display, and an active matrix display having high performance can be configured. The invention disclosed in this specification is applicable not only to active matrix liquid crystal displays but also to EL type displays and the like of the active matrix type.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A semiconductor device comprising:
    a substrate;
    a switching element including at least one thin film transistor formed over said substrate, said thin film transistor comprising:
        a semiconductor island comprising crystalline silicon formed over said substrate, said semiconductor island having at least one pair of impurity regions with a channel region therebetween;
        a gate insulating film formed on said semiconductor island;
        a gate electrode formed over said channel region with said gate insulating film interposed therebetween;
        a first insulating film comprising silicon nitride formed over said switching element; and
        an organic resin film formed on said first insulating film; and
        a pixel electrode formed over said organic resin film and electrically connected to one of said impurity regions.

2. The device according to claim 1, wherein said semiconductor device is a liquid crystal display device.

3. The device according to claim 1, wherein said semiconductor device is an EL display device.

4. The device according to claim 1, wherein said organic resin film comprises a material selected from the group consisting of polyimide and acrylic resins.

5. A semiconductor device comprising:
    a substrate;
    a switching element including at least one thin film transistor formed over said substrate, said thin film transistor comprising:
        a semiconductor island comprising crystalline silicon formed over said substrate, said semiconductor island having at least one pair of impurity regions with a channel region therebetween;
        a gate insulating film formed on said semiconductor island;
        a gate electrode formed over said channel region with said gate insulating film interposed therebetween;
        a first insulating film comprising silicon oxide formed over said switching element;
        a second insulating film comprising silicon nitride formed on said first insulating film;
        an organic resin film formed on said second insulating film; and
        a pixel electrode formed over said organic resin film and electrically connected to one of said impurity regions.

6. The device according to claim 5, wherein said semiconductor device is a liquid crystal display device.

7. The device according to claim 5, wherein said semiconductor device is an EL display device.

8. The device according to claim 5, wherein said organic resin film comprises a material selected from the group consisting of polyimide and acrylic resins.

9. A semiconductor device comprising:
    a substrate;
    a switching element including at least one thin film transistor formed over said substrate, said thin film transistor comprising:
        a semiconductor island comprising crystalline silicon formed over said substrate, said semiconductor island having at least one pair of impurity regions with a channel region therebetween;
        a gate insulating film formed on said semiconductor island; and
        a gate electrode formed over said channel region with said gate insulating film interposed therebetween;
        an insulating film comprising silicon oxynitride formed over said switching element;
        an organic resin film formed on said insulating film; and
        a pixel electrode formed over said organic resin film and electrically connected to one of said impurity regions.

10. The device according to claim 9, wherein said semiconductor device is a liquid crystal display device.

11. The device according to claim 9, wherein said semiconductor device is an EL display device.

12. The device according to claim 9, wherein said organic resin film comprises a material selected from the group consisting of polyimide and acrylic resins.

* * * * *

UNITED STATES PATENT AND TRADEMARK OFFICE
CERTIFICATE OF CORRECTION

PATENT NO. : 6,169,293 B1
DATED : January 2, 2001
INVENTOR(S) : Shunpei Yamazaki It is certified that error appears in the above-identified patent and that said Letters Patent is hereby corrected as shown below:

Drawings,
Please substitute the attached sheet 4 of 5 containing FIG. 4.

Signed and Sealed this

Fourth Day of December, 2001

*Attest:*

NICHOLAS P. GODICI
*Attesting Officer*     Acting Director of the United States Patent and Trademark Office